United States Patent
Wu et al.

(10) Patent No.: US 9,666,875 B2
(45) Date of Patent: *May 30, 2017

(54) PROCESSES FOR PRODUCING CATALYST-LAYER-SUPPORTING SUBSTRATE, CATALYST-LAYER-SUPPORTING SUBSTRATE, MEMBRANE ELECTRODE ASSEMBLY, AND FUEL CELL

(71) Applicant: KABUSHIKI KAISHA TOSHIBA, Tokyo (JP)

(72) Inventors: Mei Wu, Yokohama (JP); Tsuyoshi Kobayashi, Kawasaki (JP); Mutsuki Yamazaki, Yokohama (JP); Yoshihiko Nakano, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 101 days.

This patent is subject to a terminal disclaimer.

(21) Appl. No.: 14/259,476

(22) Filed: Apr. 23, 2014

(65) Prior Publication Data
US 2015/0044594 A1 Feb. 12, 2015

Related U.S. Application Data

(63) Continuation of application No. 12/508,954, filed on Jul. 24, 2009, now Pat. No. 8,758,959.

(30) Foreign Application Priority Data

Jul. 25, 2008 (JP) .................. 2008-192345

(51) Int. Cl.
*H01M 4/90* (2006.01)
*C23C 14/20* (2006.01)
(Continued)

(52) U.S. Cl.
CPC ......... *H01M 4/9083* (2013.01); *C23C 14/205* (2013.01); *H01M 4/8605* (2013.01);
(Continued)

(58) Field of Classification Search
None
See application file for complete search history.

(56) References Cited

U.S. PATENT DOCUMENTS 4,126,934 A 11/1978 Richter et al.
4,985,386 A 1/1991 Tsurumi et al.
(Continued)

FOREIGN PATENT DOCUMENTS

JP 2001-160402 A 6/2001
JP 2003-208908 A 7/2003
(Continued)

OTHER PUBLICATIONS

S.R. Narayanan and Jay Whitacre, IV.J.4 Advanced Catalysts for Direct Methanol Fuel Cells, DOE Hydrogen Program, FY 2004 Progress Report, 2004, pp. 610-615.
(Continued)

*Primary Examiner* — Sarah A Slifka
(74) *Attorney, Agent, or Firm* — Oblon, McClelland, Maier & Neustadt, L.L.P.

(57) ABSTRACT

A catalyst-layer-supporting substrate comprising a substrate supporting a catalyst layer; wherein the catalyst layer comprises two or more porous catalyst metal particle layers that are superposed alternately with (i) two or more intersticed layers comprising at least one element selected from the group consisting of Mn, Fe, Co, Ni, Zn, Sn, Al, and Cu; or (ii) two or more fibrous carbon layers having interstices among fibers of the fibrous carbon. A method for forming a catalyst-layer-supporting structure that comprises porous catalyst metal particle by removing a pore-forming metal (Continued)

from a mixture layer containing a pore-forming metal and a catalyst metal.

21 Claims, 4 Drawing Sheets

(51) Int. Cl.
- *H01M 4/86* (2006.01)
- *H01M 4/88* (2006.01)
- *H01M 8/1004* (2016.01)
- *H01M 4/92* (2006.01)
- *H01M 8/1011* (2016.01)

(52) U.S. Cl.
CPC ....... *H01M 4/8814* (2013.01); *H01M 4/8871* (2013.01); *H01M 4/8878* (2013.01); *H01M 4/9041* (2013.01); *H01M 4/926* (2013.01); *H01M 8/1004* (2013.01); *H01M 8/1011* (2013.01); *H01M 2250/30* (2013.01); *Y02B 90/18* (2013.01); *Y02E 60/523* (2013.01); *Y02P 70/56* (2015.11)

(56) References Cited

U.S. PATENT DOCUMENTS

| | | |
|---|---|---|
| 7,189,472 B2 | 3/2007 | Suenaga et al. |
| 7,407,722 B2 | 8/2008 | Tanaka et al. |
| 2006/0189132 A1 | 8/2006 | Iwabuchi et al. |

FOREIGN PATENT DOCUMENTS

| | | |
|---|---|---|
| JP | 2007-507328 | 3/2007 |
| JP | 2008-229514 A | 10/2008 |
| JP | 2009-512976 A | 3/2009 |
| WO | WO02/073722 | 9/2002 |
| WO | WO 2007/045763 A1 | 4/2007 |

OTHER PUBLICATIONS

Japanese Office Action Issued Mar. 8, 2013 in Patent Application No. 2008-192345 (with English translation).

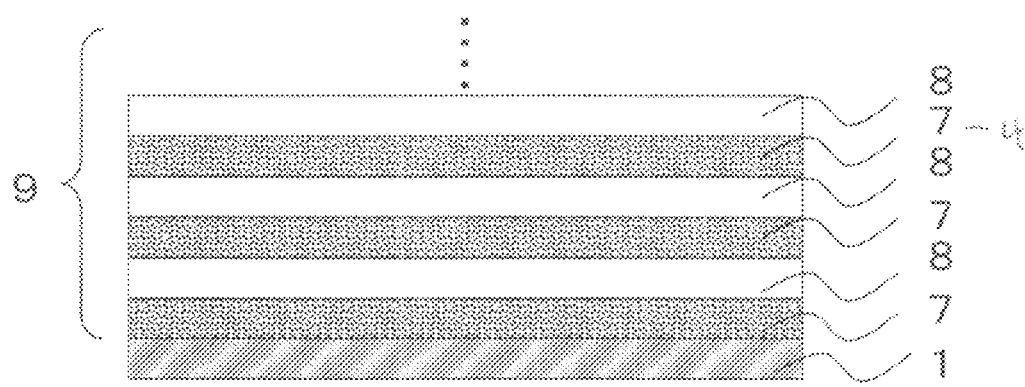

PROCESSES FOR PRODUCING CATALYST-LAYER-SUPPORTING SUBSTRATE, CATALYST-LAYER-SUPPORTING SUBSTRATE, MEMBRANE ELECTRODE ASSEMBLY, AND FUEL CELL

CROSS-REFERENCE TO RELATED APPLICATIONS

This application is a continuation of U.S. application Ser. No. 12/508,954, now U.S. Pat. No. 8,758,959, which was filed Jul. 24, 2009 and was based upon and claims the benefit of priority from the prior Japanese Patent Application No. 2008-192345, filed on Jul. 25, 2008, the entire contents of which are incorporated herein by reference.

BACKGROUND OF THE INVENTION

1. Field

The present invention relates to processes for producing a catalyst-layer-supporting substrate and to a catalyst-layer-supporting substrate, a membrane electrode assembly, and a fuel cell.

2. Description of the Related Art

Polymer fuel cells, for example, methanol type polymer fuel cells in which a methanol solution is used as a fuel, can work at low temperatures and can be reduced in size and weight. Because of this, polymer fuel cells are recently being enthusiastically investigated as power sources for mobile appliances, etc. However, the electrodes of such fuel cells mainly employ noble-metal catalysts and, hence, the fuel cells are highly costly and have not yet reached such a level that the fuel cells can spread widely. There is a desire for a technique which brings about high fuel cell performance with a small amount of a noble-metal catalyst.

For producing electrodes for conventional fuel cells, a method is generally employed in which a noble-metal catalyst, a proton conductor, a solvent, etc. are mixed together to produce a slurry and this slurry is applied to a substrate. This method, however, has a problem that the noble-metal loss in the process is as large as about 30%.

Methods of electrode production by sputtering or vapor deposition are being investigated as techniques reduced in noble-metal loss in the process.

For example, a technique in which a catalyst metal such as, e.g., a noble metal is sputtered on a substrate and a layer of particulate carbon is then formed thereon has been reported in WO 2002/073722. However, use of this technique in producing a catalyst layer has a problem that fine catalyst metal particles aggregate to form large particles, resulting in an insufficient efficiency of catalyst metal utilization.

On the other hand, a technique has been reported in which an easy-to-dissolve metal is used as a pore-forming metal to form an alloy or mixture thereof with a catalyst metal by sputtering or vapor deposition and a porous structure is thereafter formed in the resultant catalyst layer by a pore formation process (U.S. Pat. No. 4,126,934 and U.S. Patent Publication No. 2006/0189132). Furthermore, a technique has been reported which includes sputtering a catalyst metal, subsequently forming a layer of a pore-forming metal by sputtering, and then forming a porous structure in the catalyst layer by a pore formation process (JP-T 2007-507328). However, all these techniques are insufficient in the efficiency of catalyst utilization. A further improvement is desired.

BRIEF SUMMARY OF THE INVENTION

In view of those circumstances, the invention may provide a process for producing a catalyst-layer-supporting substrate, including:

a layer superposition step including a first step in which at least one first pore-forming metal and at least one catalyst metal are sputtered or vapor-deposited on a substrate to form a mixture layer containing the first pore-forming metal and the catalyst metal and a second step in which at least one second pore-forming metal is sputtered or vapor-deposited on the mixture layer to form an interlayer containing the second pore-forming metal, the first step and the second step being alternately conducted repeatedly two or more times to thereby form a multilayer structure containing layers each of which is the mixture layer and layers each of which is the interlayer; and a pore formation step in which after the layer superposition step, the first and second pore-forming metals in the multilayer structure are dissolved away to obtain a catalyst layer.

The invention further may provide a process for producing a catalyst-layer-supporting substrate, including:

a layer superposition step including a first step in which at least one first pore-forming metal and at least one catalyst metal are sputtered or vapor-deposited on a substrate to form a mixture layer containing the first pore-forming metal and the catalyst metal and a second step in which fibrous carbon is synthesized on the mixture layer to form an interlayer containing the fibrous carbon, the first step and the second step being alternately conducted repeatedly two or more times to thereby form a multilayer structure containing layers each of which is the mixture layer and layers each of which is the interlayer; and a pore formation step in which after the layer superposition step, the multilayer structure is subjected to a pore formation treatment to dissolve away the first pore-forming metal and thereby obtain a catalyst layer.

The invention furthermore may provide a catalyst-layer-supporting substrate, including: a substrate and a catalyst layer formed on the substrate, the catalyst layer including two or more porous catalyst metal particle aggregate layers superposed alternately with two or more intersticed layers or fibrous-carbon layers.

The invention still further may provide a membrane electrode assembly, including:

an anode-catalyst-layer-supporting substrate including a first substrate and an anode catalyst layer formed on the first substrate, the anode catalyst layer containing two or more porous anode catalyst metal particle aggregate layers superposed alternately with two or more intersticed layers or fibrous-carbon layers, a cathode-catalyst-layer-supporting substrate including a second substrate and a cathode catalyst layer formed on the second substrate, the cathode catalyst layer containing two or more porous cathode catalyst metal particle aggregate layers superposed alternately with two or more intersticed layers or fibrous-carbon layers, and a proton-conductive membrane sandwiched between the anode catalyst layer and the cathode catalyst layer.

The invention still further may provide a fuel cell, including: the membrane electrode assembly described above.

According to one example of the embodiments of the invention, the efficiency of catalyst metal utilization in a catalyst layer can be improved. Furthermore, a high-power fuel cell can be provided using the catalyst layer.

BRIEF DESCRIPTION OF THE DRAWINGS

FIG. 2 is a diagrammatic sectional view illustrating a catalyst-layer-supporting substrate production step according to one example of the embodiments of the invention.

DETAILED DESCRIPTION OF THE INVENTION

Figure 1A:
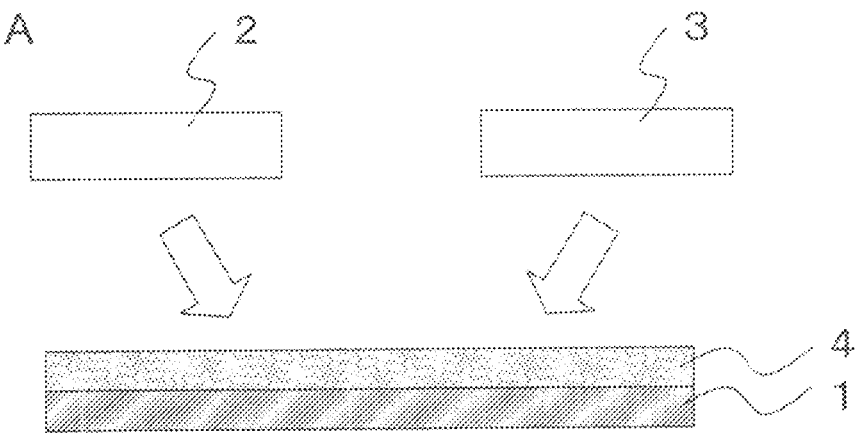
FIGS. 1A, 1B and 1C are diagrammatic sectional views illustrating catalyst-layer-supporting substrate production steps according to one example of embodiments of the invention.

In this specification, all the layers which are disposed between a substrate and a proton-conductive membrane and contain a catalyst metal are inclusively referred to as a catalyst layer.

The present inventors found that for improving the efficiency of catalyst metal utilization in the catalyst layer in an electrode of a fuel cell, it is preferable to control the microstructure of the catalyst layer in the following manner.

(1) In the electrode of a fuel cell, the efficiency of catalyst utilization highly depends on the density of the three-phase interface containing the fuel/catalyst/proton conductor. It is therefore preferable that the electrode should have micropores so as to result in the three-phase interface as much as possible.

(2) The electrode preferably has fine pores which enable fuel supply, discharge of products, etc. to be smoothly conducted during power generation.

(3) Although it is preferable to introduce a proton conductor to around catalyst metal particles after the formation of a catalyst layer, pores having a larger size than the fine pores preferable for fuel supply, discharge of products, etc. during power generation are preferably possessed as pores for introducing the proton conductor.

It is therefore preferable that pores of different sizes should be present in the catalyst layer in a preferably distributed state so as to satisfy those requirements.

Various methods were further investigated based on the knowledge shown above. As a result, the inventors have found that the objective catalyst layer is obtained by the following process.

Namely, a layer superposition step is conducted in which the deposition of a mixture layer of a first pore-forming metal and a catalyst metal by sputtering or vapor deposition and the deposition of either an interlayer of a second pore-forming metal or an interlayer of fibrous carbon by sputtering or vapor deposition are alternately conducted repeatedly two or more times to form a multilayer structure on a substrate. Thereafter, the multilayer structure is subjected to a pore formation step in which the first and second pore-forming metals are dissolved away.

Through the pore formation step, the catalyst metal particles aggregate and each mixture layer becomes a catalyst metal particle aggregate layer with a porous structure having micropores around the particles. On the other hand, each interlayer of a pore-forming metal or each interlayer of fibrous carbon becomes an intersticed layer having large interstices or a fibrous-carbon layer having interstices among fibers of the fibrous carbon. Finally, a catalyst-layer-supporting substrate having a structure containing two or more such aggregate layers superposed alternately with two or more such intersticed or fibrous-carbon layers is obtained. In the catalyst layer obtained by this process, the catalyst metal is present in the form of fine particles and fine pores of different sizes have been formed in a preferably distributed state. Namely, the catalyst layer has: micropores which are located around the catalyst metal particles and give a large amount of the three-phase interface containing fuel/catalyst/proton conductor; fine pores which have a larger size than the micropores and enable fuel supply, discharge of products, etc. to be smoothly conducted; and pores having an even larger size which are located outside the micropores and fine pores and enable a proton conductor to be introduced therethrough. These three kinds of pores are distributed in a layered arrangement. As a result, electrode reactions on the surface of the catalyst metal particles, fuel supply/product discharge, and proton conductor introduction are smoothly conducted. The presence of the pores having a large size further has the function of preventing the catalyst metal particles from excessively aggregating. Because of these, a catalyst layer having a high efficiency of catalyst utilization can be finally obtained.

Modes for carrying out one example of embodiments of the invention will be explained below.

(Example of First Embodiment)

In FIGS. 1A, 1B and 1C and FIG. 2 are shown diagrammatic views illustrating catalyst-layer-supporting substrate production steps according to one example of a first embodiment.

1. Layer Superposition Step (First Step)

First, as shown in FIG. 1A, a catalyst metal 2 and a first pore-forming metal 3 are used as targets to simultaneously sputter the catalyst metal and the pore-forming metal on a substrate 1. Alternatively, a catalyst metal and a first pore-forming metal are simultaneously vapor-deposited on a substrate 1. Thus, a mixture layer 4 is formed.

As the substrate 1, an electroconductive substrate material or a proton-conductive substrate material can be used.

Examples of the electroconductive substrate material include a porous paper containing conductive carbon fibers. However, the electroconductive substrate material should not be construed as being limited to the carbon paper, and any substrate excellent in electrical conductivity and stability may be used. Besides carbon materials, a ceramic porous substrate having electrical conductivity may be used as the electroconductive substrate material.

Examples of the proton-conductive substrate material include fluorochemical electrolyte membranes, hydrocarbon type electrolyte membranes, and composite oxides having the nature of an ultrastrong acid. However, the proton-conductive substrate material should not be construed as being limited to these examples, and any material having proton conductivity may be used. In the case where a catalyst layer is formed on a proton-conductive substrate material, it is preferable to regulate parameters including substrate temperature in the sputtering/vapor deposition while taking account of the thermal stability of the proton-conductive substrate material.

The catalyst metal 2 desirably is one which is satisfactory in catalytic activity, electrical conductivity, and stability. For example, a noble-metal catalyst can be used. The term "noble-metal catalyst" means a catalyst including one or more of noble-metal elements such as Pt, Ru, Rh, Os, Ir, Pd, and Au.

In the case where such a noble-metal catalyst is used in an anode electrode, a composition represented by $Pt_yRu_zT_{1-y-z}$ can, for example, be employed. In the formula, y satisfies $0.2 \leq y \leq 0.8$; z satisfies $0 \leq z \leq 0.5$; and element T is at least one element selected from the group consisting of W, Hf, Si, Mo, Ta, Ti, Zr, Ni, Co, Nb, V, and Cr.

On the other hand, when such a noble-metal catalyst is used on the cathode side, a composition represented by $Pt_uT_{1-u}$ can, for example, be employed. In the formula, u satisfies $0.2 \leq u \leq 0.75$ and element T is at least one element selected from the group consisting of W, Hf, Si, Mo, Ta, Ti, Zr, Ni, Co, Nb, V, and Cr.

The catalyst metal 2 should not be construed as being limited to noble-metal catalysts, and use may be made of an oxide catalyst, nitride catalyst, carbide catalyst, or the like.

It is desirable that the first pore-forming metal 3 should be Mn alone or Fe alone or be a mixture of at least two metals, i.e., an alloy containing at least one metal selected from the group consisting of Co, Ni, Zn, Sn, and Al and at least one metal selected from the group consisting of Mn and Fe. This is because Mn and Fe are thought to have the high ability to form pores (for example, in the case of an acid treatment) to give a catalyst layer having a high porosity and thereby improve the efficiency of catalyst metal utilization.

In many cases, the first pore-forming metal in the mixture layer 4 formed by sputtering or vapor deposition forms an alloy with the noble-metal catalyst. Furthermore, the pore-forming ability of pore-forming metals generally vary depending on the kinds of the elements. It is therefore preferable that for attaining a high porosity, the proportions of individual first pore-forming metals to the catalyst metal in the mixture layer 4 should be separately regulated. For example, in the case of a metal having low pore-forming ability, it is, for example, preferable to incorporate the metal in a larger amount into the mixture layer.

For the sputtering or vapor deposition, use may be made of a multinary-alloy target or evaporation source made of the catalyst metal and the first pore-forming metal. Alternatively, a target or evaporation source of the catalyst metal 2 and a target or evaporation source of the first pore-forming metal 3 may be separately prepared and used to conduct simultaneous sputtering or vapor deposition as shown in FIG. 1A. The rate of sputtering or vapor deposition may be, for example, 0.5-100 nm/min. The temperature of the substrate during the sputtering is desirably regulated to 400° C. or lower. When the substrate temperature is higher than that temperature, there are cases where phase separation occurs in the catalyst particles, resulting in unstable catalytic activity. From the standpoint of reducing the cost of cooling the substrate, it is desirable that the lower limit of the substrate temperature should be 10° C.

(Second Step)

Figure 1B:
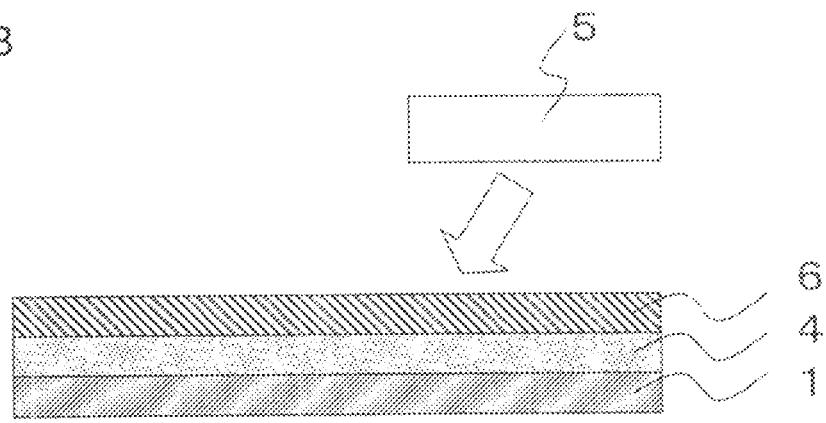

Subsequently, (i) a second pore-forming metal 5 is used as a target or evaporation source to sputter or vapor-deposit the second pore-forming metal on the mixture layer 4 formed in the first step to thereby form an interlayer 6 of the second pore-forming metal as shown in FIG. 1B. Alternatively, (ii) fibrous carbon is synthesized to form an interlayer 6 of the fibrous carbon.

First, case (i) is explained.

The interlayer 6 of the second pore-forming metal finally becomes an intersticed layer in the catalyst layer.

As the second pore-forming metal 5, at least one element selected from the group consisting of Mn, Fe, Co, Ni, Zn, Sn, Al, and Cu can be used. The same metal as the first pore-forming metal 3 may be used, or a metal different from the metal 3 may be used.

Although a target or evaporation source of a second pore-forming metal is used to conduct sputtering or vapor deposition, a multinary-alloy target or evaporation source may be used in the case of forming a layer containing two or more pore-forming metal materials. Alternatively, targets or evaporation source of the respective metals may be used to conduct simultaneous sputtering or vapor deposition.

The thickness of the interlayers 6 of the second pore-forming metal desirably is from 10 nm to 500 nm per layer. When the thickness thereof is smaller than 10 nm, the intersticed layers are too small in size and there is a possibility that the effects obtained might be low. When the thickness thereof is larger than 500 nm, there is a high possibility that catalyst particles might be washed away by washing and this may result in unevenness in fuel cell performance.

It is also possible to sputter or vapor-deposit carbon simultaneously with the second pore-forming metal during the formation of an interlayer. Carbon is thought to be effective in inhibiting the growth of catalyst particles, forming conducting paths, etc. Carbon changes little in crystalline state upon treatment with an acid. The addition of carbon enables a preferable porous structure to be formed and improves the durability of the porous catalyst-layer structure. The crystalline state of the carbon is not particularly limited, and carbon in an amorphous state or crystalline state can be formed by changing substrate temperature and growth rate in the sputtering or vapor deposition process. In the case where crystalline carbon is used, there is an effect that the electrical conductivity and stability of the carbon are improved.

Case (ii) is then Explained.

The formation of interlayers 6 of fibrous carbon enables the final catalyst layer to have large interstices among fibers of the fibrous carbon. It is thought that these interlayers 6 can form a preferable porous structure and bring about the same effects as the intersticed layers obtained through the sputtering or deposition of the second pore-forming metal shown in case (i). It is further thought that the application of fibrous carbon is effective in inhibiting the growth of catalyst metal particles, forming conducting paths, etc. In addition, fibrous carbon changes little in crystalline state upon treatment with an acid and improves the durability of the porous catalyst-layer structure.

Examples of the fibrous carbon include carbon nanofibers (CNFs) and carbon nanotubes (CNTs) formed by the plasma-assisted CVD method. Carbon black formed by coating fluid application is also possible.

In the case where fibrous carbon is formed by the plasma-assisted CVD method, a catalyst for synthesizing fibrous carbon such as CNFs or CNTs is sputtered by a known technique on the mixture layer formed in the first step. Thereafter, a fibrous carbon layer is formed in a $C_2H_2/NH_3$ mixture atmosphere at 30-400° C. The catalyst metal for fibrous-carbon synthesis is not particularly limited, and examples thereof include Ni, Fe, and Co. More desirable is Ni.

The thickness of the interlayers 6 of fibrous carbon desirably is from 0.5 μm to 50 μm per layer. When the thickness thereof is smaller than 0.5 μm, the porous structure is too small in size and there is a possibility that the effects obtained might be low. When the thickness thereof is larger than 50 μm, there is a high possibility that the catalyst layer has high resistance and this may result in unevenness in fuel cell performance.

Figure 1C:
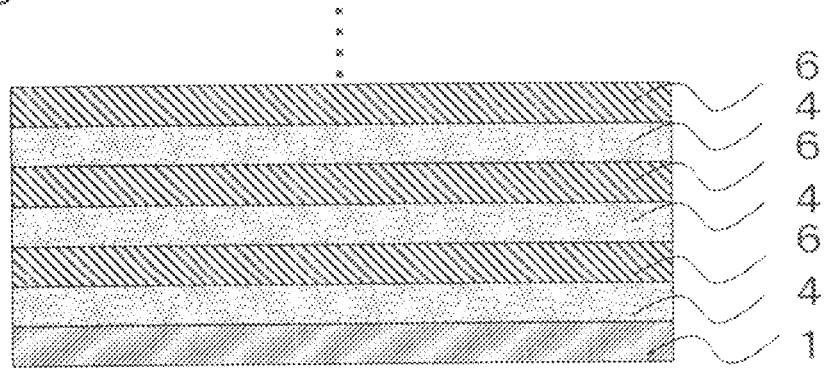

The first step and second step are repeated to superpose mixture layers 4 and interlayers 6 as shown in FIG. 1C. It is desirable that sputtering or vapor deposition should be alternately repeated to superpose 5-200 mixture layers 4 and 5-200 interlayers 6 in order to ensure a sufficient catalyst amount. To deposit 5 or more layers of each kind can produce the effect that the formation of a porous structure of catalyst particles and an improvement in catalyst loading are apt to be reconciled. On the other hand, to regulate the number of layers of each kind to 200 or smaller can produce the effect that this deposition leads to a reduction in process cost.

In forming mixture layers and interlayers in one embodiment of the invention, a compositional gradient which ranges over two or more mixture layers and interlayers may be imparted by regulating compositions in the sputtering or vapor deposition. Thus, a porous catalyst layer having a porosity gradient can also be finally obtained. For example, layers on the side near to the proton-conductive substrate material are formed so as to have an increased catalyst metal content and a reduced porosity and layers on the opposite side are formed so as to have a reduced catalyst metal content, whereby the efficiency of catalyst utilization can be heightened.

2. Pore Formation Step

Subsequently, the multilayer structure is subjected to a pore formation treatment to form a porous catalyst layer structure having a preferable porous structure. The pore formation treatment is conducted for the purpose of removing the first and second pore-forming metals from the mixture layers 4 and interlayers 6. As shown in FIG. 2, the mixture layers 4 become catalyst metal fine-particle aggregate layers 7 in which the fine particles of the catalyst metal have aggregated, while the interlayers 6 become intersticed layers or fibrous-carbon layers 8.

Specifically, a pore formation treatment with acid washing is desirable because this treatment is easy. However, the pore formation treatment should not be construed as being limited to this process, and any other process capable of forming a sufficient porous structure may be employed. For example, pore formation by washing with an alkali solution or pore formation by electrolysis may be used.

In the case of conducting acid washing, the pore formation can be accomplished, for example, by using nitric acid, hydrochloric acid, sulfuric acid, or a liquid mixture of two or more of these to conduct the treatment for a period of about from 5 minutes to 50 hours. This acid treatment may be conducted while heating the system at about 50-100° C. In some cases, a bias voltage may be applied or a post-treatment such as a heat treatment may be conducted, in order to accelerate the dissolution of the pore-forming metal in the catalyst and the interlayer metal.

Part of the first or second pore-forming metal may remain in the catalyst layer after the pore formation step. These residual metals can form a stable oxide and are thought to be not only effective in inhibiting the growth of catalyst particles but also capable of contributing to the supply of a fuel to catalytic reaction. Namely, the residual metals are thought to have the function of accelerating the supply of water in the case of an anode or accelerating the supply of oxygen in the case of a cathode.

By the processes described above, a catalyst-layer-supporting substrate containing a substrate 1 and a catalyst layer 9 formed thereon is obtained.

The catalyst-layer-supporting substrate finally obtained has a structure including a catalyst layer containing two or more porous catalyst metal particle aggregate layers 7 superposed alternately with two or more intersticed layers or fibrous-carbon layers 8.

In the catalyst layer 9 finally obtained, the catalyst metal fine-particle aggregate layers 7 desirably have a porosity of 40%-90%. When the porosity thereof is lower than 40%, there are often cases where a sufficient porous structure cannot be formed, resulting in low fuel cell performance. When the porosity thereof is 90% or higher, there is a high possibility that catalyst particles might be washed away by washing and this may result in considerable unevenness in fuel cell performance.

Although porosity values were shown above, porosity in this specification was determined in the following manner.

Porosity=1−[(content of atoms of pore-forming metal (s) in catalyst layer after pore formation step)+ (content of atoms of catalyst metal after pore formation step)]/[(content of atoms of pore-forming metal(s) in catalyst layer before pore formation step)+(content of atoms of catalyst metal before pore formation step)]

In this specification, the following method was used for porosity determination.

Layers having the same constitution as the mixture layers are sputtered on a substrate, and this substrate is subjected to the same pore formation treatment as for the multilayer structure. The mixture layers which have not undergone the pore formation treatment and those which have undergone the treatment are analyzed for composition by the ICP method to determine the porosity. The pores of the catalyst metal particle aggregate layers 7 have a diameter in the range of, for example, from 1 nm to 9 nm.

It is desirable from the standpoint of catalytic performance that the thickness of the catalyst metal particle aggregate layers should be from 10 nm to 500 nm per layer and the thickness of the intersticed layers should be from 10 nm to 500 nm per layer. It is also desirable from the standpoint of catalytic performance that the thickness of the catalyst metal particle aggregate layers should be from 10 nm to 500 nm per layer and the thickness of the fibrous-carbon layers should be from 500 nm to 5,000 nm per layer.

The membrane electrode assembly according to this embodiment includes a pair of catalyst-layer-supporting substrates (anode and cathode) having the constitution described above and a proton-conductive substrate material (proton-conductive membrane) disposed between the respective catalyst layers of the anode and cathode. The fuel cell according to an embodiment of the invention includes this membrane electrode assembly.

Figure 3:
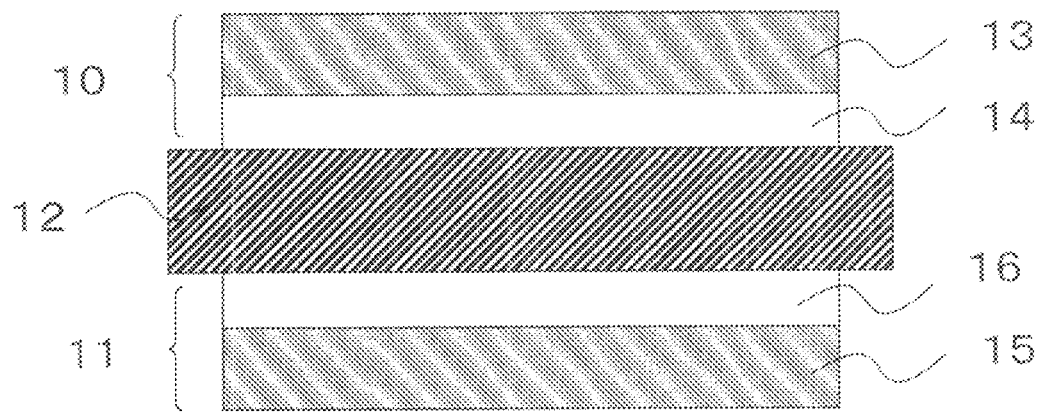
FIG. 3 is a side view diagrammatically illustrating one example of the embodiments of the membrane electrode assembly of the invention.

FIG. 3 is a side view diagrammatically illustrating one embodiment of the membrane electrode assembly (MEA) of the invention.

The MEA shown in FIG. 3 includes an anode 10, a cathode 11, and a proton-conductive membrane 12. The anode includes a diffusing layer 13 and an anode catalyst layer 14 formed thereon. The cathode 11 includes a diffusing layer 15 and a cathode catalyst layer 16 formed thereon. The anode 10 and the cathode 11 are produced so that the anode catalyst layer 14 faces the cathode catalyst layer 16 through the proton-conductive membrane 12.

The catalyst layer 9 obtained by the processes of the embodiment of the invention for producing a catalyst-layer-supporting substrate can be used as the anode catalyst layer 14 and/or the cathode catalyst layer 16. The substrate 1 can be used as the diffusing layer 13 and/or the diffusing layer 15.

As the diffusing layers 13 and 15, an electroconductive porous sheet can be used. As the electroconductive porous sheet, a sheet containing a material having gas permeability or liquid permeability, such as, for example, a carbon cloth or carbon paper can be used.

The anode catalyst layer 14, cathode catalyst layer 16, and proton-conductive membrane 12 include a proton-conductive substance. As this proton-conductive substance, any material capable of conducting protons can be used without particular limitations. Examples of the proton-conductive substance include fluororesins having sulfo groups, such as Nafion (manufactured by DuPont), Flemion (manufactured by Asahi Glass), and Aciplex (manufactured by Asahi Chemical), and inorganic materials such as tungstic acid and phosphotungstic acid. However, the proton-conductive substance should not be construed as being limited to these examples.

The fuel cell according to this embodiment includes the MEA, a means for supplying a fuel to the anode, and a means for supplying air to the cathode. Although the fuel cell may employ one MEA, two or more MEAs may be used. By using two or more MEAs, a higher electromotive force can be obtained. As the fuel, methanol, ethanol, formic acid, an aqueous solution of one or more members selected from the group consisting of these, or the like can be used.

Examples of the embodiments of the invention are given below. However, the invention should not be construed as being limited to the following Examples.

EXAMPLES 1 TO 10

A carbon paper having a carbon layer with a thickness of 5-50 μm on a surface thereof (trade name, Toray 060) was used as a substrate. A multinary-alloy target including catalyst metals and at least one first pore-forming metal was used to form, by sputtering, a mixture layer having a thickness of 50-300 nm and having the composition shown in Table 1 (Table 1 further shows the kind(s) of element of the first pore-forming metal(s) in the mixture layer, the remaining elements being the catalyst metals). Thereafter, a target including at least one second pore-forming metal was used to form an interlayer having a thickness of 50-200 nm and having the composition shown in Table 1. These sputtering processes each were repeated several tens of times so as to result in a Pt—Ru loading of 2 mg/cm$^2$. Thus, a multilayered electrode substrate was produced. Thereafter, this electrode was immersed in 30% by weight sulfuric acid at 80° C. to conduct an acid treatment for 2 hours, subsequently washed with pure water, and dried to obtain a catalyst-layer-supporting substrate.

EXAMPLES 11 AND 12

A carbon paper having a carbon layer with a thickness of 5-50 μm on a surface thereof (trade name, Toray 060) was used as a substrate. A multinary-alloy target including catalyst metals and at least one first pore-forming metal was used to form, by sputtering, a mixture layer having a thickness of 50-300 nm and having the composition shown in Table 1 (Table 1 further shows the kind(s) of element of the first pore-forming metal(s) in the mixture layer, the remaining elements being the catalyst metals). Thereafter, Ni metal having a thickness of about 20 nm was sputtered, and a nanofiber-carbon layer having a thickness of 5-20 μm (interlayer) was formed by the plasma-assisted CVD method (temperature, 200° C.; in $C_2H_2/NH_3$ mixture atmosphere). These membrane deposition processes each were repeated several tens of times so as to result in a Pt—Ru loading of 2 mg/cm$^2$. Thus, a multilayered substrate having interlayers of fibrous carbon was produced. Thereafter, this electrode was immersed in 30% by weight sulfuric acid at 80° C. to conduct an acid treatment for 2 hours, subsequently washed with pure water, and dried to obtain a catalyst-layer-supporting substrate.

COMPARATIVE EXAMPLES 1 AND 2

A carbon paper having a carbon layer with a thickness of 5-50 μm on a surface thereof (trade name, Toray 060) was used as a substrate. A target including catalyst metals was used to sputter a layer having the composition shown in Table 1 so as to result in a Pt—Ru loading of 2 mg/cm$^2$. Thus, a catalyst layer was obtained. Thereafter, this electrode was immersed in 30% by weight sulfuric acid at 80° C. to conduct an acid treatment for 2 hours, subsequently washed with pure water, and dried.

COMPARATIVE EXAMPLE 3

A carbon paper having a carbon layer with a thickness of 5-50 μm on a surface thereof (trade name, Toray 060) was used as a substrate. A target including catalyst metals was used to form a catalyst-containing layer having the composition shown in Table 1. Thereafter, a carbon target was used to form a carbon layer on the catalyst-containing layer by sputtering. These sputtering processes were alternately repeated several tens of times each so as to result in a Pt—Ru loading of 2 mg/cm$^2$. Thus, catalyst-containing layers and carbon layers were superposed. The catalyst-containing layers had a thickness of 50-300 nm per layer, and the carbon layers had a thickness of 100 nm per layer. Thereafter, this electrode was immersed in 30% by weight sulfuric acid at 80° C. to conduct an acid treatment for 2 hours, subsequently washed with pure water, and dried.

COMPARATIVE EXAMPLE 4

A carbon paper having a carbon layer with a thickness of 5-50 μm on a surface thereof (trade name, Toray 060) was used as a substrate. A target including catalyst metals was used to form a catalyst-containing layer having the composition shown in Table 1. Thereafter, targets were used to form a $Cu_{70}C_{30}$ layer as an interlayer on the catalyst-containing layer. These sputtering processes were alternately repeated several tens of times each so as to result in a Pt—Ru loading of 2 mg/cm$^2$. Thus, catalyst-containing layers and $Cu_{70}C_{30}$ layers were superposed. The catalyst-containing layers had a thickness of 50-300 nm per layer, and the interlayers had a thickness of 5-20 μm per layer. Thereafter, this electrode was immersed in 30% by weight sulfuric acid at 80° C. to conduct an acid treatment for 2 hours, subsequently washed with pure water, and dried.

EXAMPLES 13 TO 15

A carbon paper having a carbon layer with a thickness of 5-50 μm on a surface thereof (trade name, Toray 060) was used as a substrate. A target including one or more catalyst metals and a target including a first pore-forming metal were used to form a mixture layer having a thickness of 50-300 nm and having the composition shown in Table 1. Thereafter, a target including a second pore-forming metal was used to form an interlayer having a thickness of 100-500 nm and having the composition shown in Table 1. These sputtering processes each were repeated several tens of times so as to result in a Pt loading of 1 mg/cm$^2$. Thus, a multilayered electrode substrate was produced. Thereafter, this electrode was immersed in 30% by weight sulfuric acid at 80° C. to conduct an acid treatment for 2 hours, subsequently washed with pure water, and dried.

COMPARATIVE EXAMPLE 5

A carbon paper having a carbon layer with a thickness of 5-50 µm on a surface thereof (trade name, Toray 060) was used as a substrate. A target including a catalyst metal was used to form a catalyst-containing layer having the composition shown in Table 1 by sputtering. Thereafter, a metal target was used to form an interlayer having the composition shown in Table 1. These sputtering processes were repeated so as to result in a Pt loading of 1 mg/cm$^2$. Thus, a catalyst layer was formed. The thickness of each catalyst-containing layer and that of each interlayer were respectively regulated to 3.3 nm and 6.7 nm (total thickness of the two layers, 10 nm; the thickness of the interlayer was two times the thickness of the Pt layer) as in the Table 4 given in JP-T 2007-507328. Thereafter, this electrode was immersed in 30% by weight sulfuric acid at 80° C. to conduct an acid treatment for 2 hours, subsequently washed with pure water, and dried.

Nafion (manufactured by DuPont) was imparted to the catalyst-layer-supporting substrates of Examples 1 to 12 and Comparative Examples 1 to 4 to produce electrodes for use as anodes. Each of these anodes was used in combination with a standard cathode (Pt catalyst supported on carbon black; commercial product; manufactured by Tanaka Kikinzoku). Nafion (manufactured by DuPont) was imparted to the catalyst-layer-supporting substrates of Examples 13 to 15 and Comparative Example 5 to produce electrodes for use as cathodes. Each of these cathodes was used in combination with a standard anode (Pt—Ru catalyst supported on carbon black; commercial product; manufactured by Tanaka Kikinzoku). Fuel cell electrodes, membrane electrode assemblies, and single cells were produced and evaluated by the following methods.

<Anode>

The various electrodes obtained were impregnated with 5% by weight Nafion under vacuum and dried to produce anodes having a noble-metal catalyst loading of 2 mg/cm$^2$.

<Standard Cathode>

First, 2 g of a Pt catalyst manufactured by Tanaka Kikinzoku was weighed out. A mixture of this Pt catalyst, 5 g of pure water, 5 g of a 20% Nafion solution, and 20 g of 2-ethoxyethanol was sufficiently stirred to disperse the ingredients. Thus, a slurry was produced. This slurry was applied with a control coater to a carbon paper which had undergone a water-repellent treatment (350 µm; manufactured by Toray Industries) and dried to produce a cathode having a noble-metal catalyst loading of 1 mg/cm$^2$.

<Standard Anode>

First, 2 g of a Pt—Ru catalyst manufactured by Tanaka Kikinzoku was weighed out. A mixture of this Pt—Ru catalyst, 5 g of pure water, 8 g of a 20% Nafion solution, and 20 g of 2-ethoxyethanol was sufficiently stirred to disperse the ingredients. Thus, a slurry was produced. This slurry was applied with a control coater to a carbon paper which had undergone a water-repellent treatment (350 µm; manufactured by Toray Industries) and dried to produce an anode having a noble-metal catalyst loading of 2 mg/cm$^2$.

<Cathode>

The various electrodes obtained were impregnated with 5% by weight Nafion under vacuum and dried to produce cathodes having a noble-metal catalyst loading of 1 mg/cm$^2$.

<Production of Membrane Electrode Assembly>

A square piece of 3.2×3.2 cm was cut out of each of a cathode and an anode so as to result in an electrode area of 10 cm$^2$. Nafion 117 (manufactured by DuPont) was sandwiched as a proton-conductive polymer membrane between the cathode and the anode, and this assemblage was press-bonded with heating at 125° C. for 10 minutes at a pressure of 30 kg/cm$^2$. Thus, a membrane electrode assembly was produced.

This membrane electrode assembly and a passage plate were used to produce a single cell for polymer-electrolyte fuel cells of the direct fuel supply type. A 1-M aqueous solution of methanol was fed as a fuel to the anode of this single cell at a rate of 0.6 mL/min and air was supplied to the cathode at a rate of 200 mL/min. This cell was discharged at a current density of 150 mA/cm$^2$ while keeping the cell at 60° C., and the cell voltage was measured at 30 minutes thereafter. The results obtained are shown in Table 1. The porosity of the catalyst metal fine-particle aggregate layer in each of the Examples and Comparative Examples is also shown in the table.

TABLE 1

| Example | Composition of mixture layer (Examples 1-15) or catalyst-containing layer (Comparative Examples 1-5) (at. %) | Kind of first pore-forming metal | Composition of interlayer (at. %) | Porosity of catalyst metal fine-particle aggregate layer (%) | Voltage (V) |
|---|---|---|---|---|---|
| Example 1 | PtRuMn$_6$ | (Mn) | Mn | 70% | 0.51 |
| Example 2 | PtRuMn$_3$Al$_1$ | (Mn, Al) | MnAl | 40% | 0.49 |
| Example 3 | PtRu$_{0.3}$Hf$_{0.1}$Ta$_{0.1}$Mn$_6$ | (Mn) | Mn | 60% | 0.55 |
| Example 4 | PtRu$_{0.5}$W$_{0.05}$Mo$_{0.05}$Mn$_8$ | (Mn) | Zn | 60% | 0.53 |
| Example 5 | PtRu$_{0.5}$V$_{0.1}$Ta$_{0.1}$Mn$_8$ | (Mn) | Fe | 60% | 0.52 |
| Example 6 | PtRu$_{0.3}$W$_{0.1}$Mn$_8$ | (Mn) | Cu$_{0.2}$ZnSn | 60% | 0.51 |
| Example 7 | PtRu$_{0.5}$Sn$_{0.1}$V$_{0.1}$Nb$_{0.1}$Mn$_6$ | (Mn) | MnFeC | 60% | 0.52 |
| Example 8 | PtRuMn$_6$Ni | (Mn, Ni) | MnCo | 60% | 0.52 |
| Example 9 | PtRuFe$_{10}$ | (Fe) | Fe | 60% | 0.50 |
| Example 10 | PtRuMn$_{0.5}$ | (Mn) | Mn | 20% | 0.47 |

TABLE 1-continued

| Example | Composition of mixture layer (Examples 1-15) or catalyst-containing layer (Comparative Examples 1-5) (at. %) | Kind of first pore-forming metal | Composition of inter-layer (at. %) | Porosity of catalyst metal fine-particle aggregate layer (%) | Voltage (V) |
|---|---|---|---|---|---|
| Example 11 | PtRu$_{0.5}$VMn$_9$ | (Mn) | C (fibrous carbon) | 50% | 0.51 |
| Example 12 | PtRu$_{0.5}$Ni$_{0.1}$Si$_{0.1}$Mn$_9$ | (Mn) | C (fibrous carbon) | 60% | 0.53 |
| Comparative Example 1 | PtRu | | — | 0 | 0.42 |
| Comparative Example 2 | PtRuAl$_3$ (U.S. Pat. No. 4,126,934 and U.S. Patent Publication No. 2006/0189132) | | — | 25% | 0.44 |
| Comparative Example 3 | PtRu (WO 2002/073722) | | C | 0 | 0.40 |
| Comparative Example 4 | PtRu (WO 2002/073722) | | Cu$_{70}$C$_{30}$ | 0 | 0.45 |
| Example 13 | PtMn$_9$ | (Mn) | Mn | 85% | 0.50 |
| Example 14 | PtFe$_{10}$ | (Fe) | Fe | 45% | 0.49 |
| Example 15 | PtCoMn$_8$ | (Mn) | Mn | 80% | 0.50 |
| Comparative Example 5 | Pt (JP-T 2007-507328) | | Mn | 0 | 0.40 |

Figure 4A:
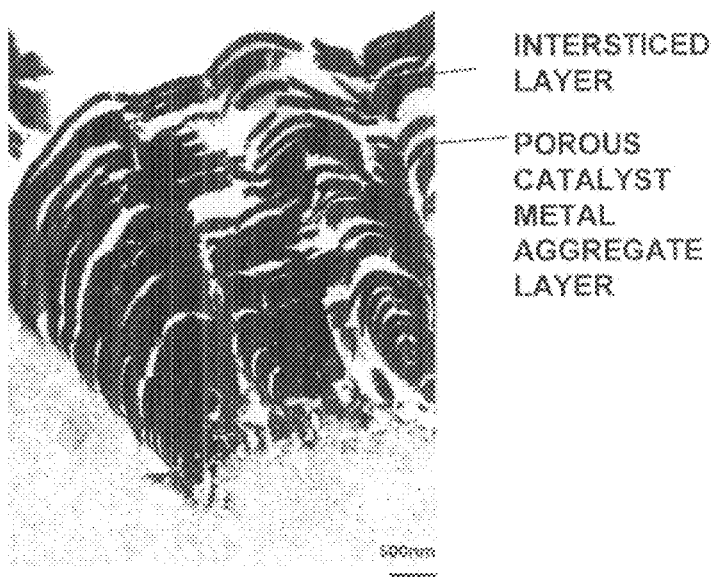
FIGS. 4A and 4B are Transmission Electron Microscope (TEM) photographs of a cross section in Example 1 according to the invention.
Figure 4B:
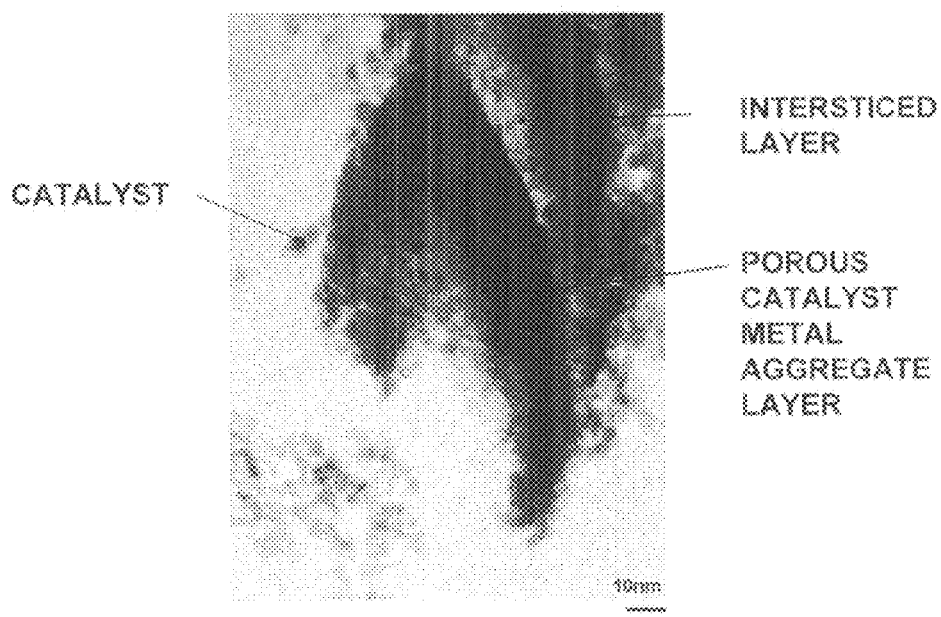

As apparent from the results given in Table 1, a comparison between Examples 1 to 12 and Comparative Examples 1 to 4 and a comparison between Examples 13 to 15 and Comparative Example 5 show that the electrodes produced according to the embodiment of the invention attained a high voltage and high fuel cell performance. Sections of those various electrodes were examined with a TEM. As a result, it was ascertained that the electrodes of Examples 1 to 15 had a porous structure which had developed, whereas the catalyst particles in Comparative Examples 1 to 4 had aggregated to such a degree that almost no pores were present in the catalyst particle aggregate layers. Furthermore, the catalyst metal fine-particle aggregate layers in Examples 1 to 15 were found to have a porous structure having micropores formed therein. FIGS. 4A and 4B are TEM photographs of a section of the catalyst-layer-supporting substrate of Example 1 (FIG. 4A, low magnification; FIG. 4B, high magnification). From the TEM photographs, a catalyst layer containing catalyst metal fine-particle aggregate layers superposed alternately with intersticed layers is ascertained. It is also ascertained that the catalyst metal fine-particle aggregate layers have a porous structure having micropores with a pore size of about several nanometers formed therein. From the results of the compositional analysis of the catalyst layer which had been conducted before and after acid washing, it was found that most of the catalyst metal fine-particle aggregate layers in Examples 1 to 15 had a porosity of about 60%. It can be seen that to form micropores and intersticed layers having a larger pore size in combination by introducing a first pore-forming metal and a second pore-forming metal into the catalyst layer is important for high fuel cell performance. A comparison between Example 1 and Example 10 shows that the porosity of the catalyst metal fine-particle aggregate layers is desirably 40% or higher.

Incidentally, a reformed-gas type polymer-electrolyte fuel cell employing electrodes produced by the processes of the embodiment of the invention was ascertained to have the same tendency as described above. Consequently, the processes of the embodiment of the invention are effective also for reformed-gas type polymer-electrolyte fuel cells.

What is claimed is:
1. A catalyst-layer-supporting substrate comprising:
a substrate supporting a catalyst layer;
wherein the catalyst layer comprises
two or more porous catalyst metal particle layers having a porosity ranging from 20% to 90% that are superposed alternately with
(i) two or more intersticed layers comprising at least one element selected from the group consisting of Mn, Fe, Co, Ni, Zn, Sn, Al, and Cu; or
(ii) two or more fibrous-carbon layers having interstices among fibers of the fibrous carbon, wherein for (ii) the two or more porous catalyst metal particle layers having a porosity ranging from 20% to 90% are produced by removing a pore-forming metal from a mixture layer containing a pore-forming metal and the catalyst metal.

2. The catalyst-layer-supporting substrate according to claim 1 that comprises (i) two or more intersticed layers comprising at least one element selected from the group consisting of Mn, Fe, Co, Ni, Zn, Sn, Al, and Cu, wherein said intersticed layers have a thickness ranging from 10 nm to 500 nm.

3. The catalyst-layer-supporting substrate according to claim 1 that comprises (ii) two or more fibrous-carbon layers having interstices among fibers of the fibrous carbon, wherein said fibrous carbon layers comprise carbon nanofibers, carbon nanotubes and/or carbon black.

4. The catalyst-layer-supporting substrate according to claim 1, comprising catalyst metal particle layers having a thickness of from 10 nm to 500 nm per layer and comprising fibrous-carbon layers having interstices among fibers of the fibrous carbon having a thickness of from 500 nm to 5,000 nm per layer.

5. The catalyst-layer-supporting substrate of claim 1, wherein the catalyst metal is at least one noble-metal element or an alloy of at least one noble-metal element and at least one element selected from the group consisting of W, Hf, Si, Mo, Ta, Ti, Zr Ni, Co, Nb, V, and Cr.

6. The catalyst-layer-supporting substrate of claim 1, wherein the porous catalyst metal particle layers comprise at least one noble-metal catalyst selected from the group consisting of Pt, Ru, Rh, Os, Ir, Pd and Au.

7. The catalyst-layer-supporting substrate of claim 1, wherein the porous catalyst metal particle layers comprise at least one noble-metal catalyst having the formula $Pt_y Ru_z T_{1-y-z}$, wherein y satisfies $0.2 \leq y \leq 0.8$ and z satisfies $0 \leq z \leq 0.5$ and T is at least one of W, Hf, Si, Mo, Ta, Ti, Zr Ni, Co, Nb, V and Cr.

8. The catalyst-layer-supporting substrate of claim 1, wherein the porous catalyst metal particle layers comprise at least one noble-metal catalyst having the formula $Pt_u T_{1-u}$, wherein u satisfies $0.2 \leq u \leq 0.75$ and T is at least one of W, Hf, Si, Mo, Ta, Ti, Zr, Ni, Co, Nb, V and Cr.

9. The catalyst-layer-supporting substrate of claim 1, wherein the porous catalyst metal particle layers comprise at least one oxide catalyst, nitride catalyst or carbide catalyst.

10. The catalyst-layer-supporting substrate of claim 1, wherein the catalyst metal particle layers are made from a first pore-forming metal that is (i) Mn alone or Fe alone or (ii) the first pore-forming metal is an alloy containing at least one metal selected from the group consisting of Co, Ni, Zn, Sn, and Al and at least one metal selected from the group consisting of Mn and Fe.

11. The catalyst-layer-supporting substrate of claim 1, wherein the pore-forming metal in (ii) comprises at least one metal selected from the group consisting of Mn, Fe, Co, Ni, Zn, Sn, Al, and Cu.

12. The catalyst-layer-supporting substrate of claim 1 that comprises at least one electroconductive substrate material selected from the group consisting of a porous paper containing conductive carbon fibers and a ceramic porous substrate having electrical conductivity.

13. The catalyst-layer-supporting substrate of claim 1 that comprises at least one proton conductive substrate material selected from the group consisting of a fluorochemical electrolyte membrane, hydrocarbon type electrolyte membranes and composition oxides having the nature of an ultrastrong acid.

14. The catalyst-layer-supporting substrate of claim 1 that is made by a process comprising:
a layer superposition step comprising a first step in which at least one first pore-forming metal and at least one catalyst metal are sputtered or vapor-deposited on a substrate to form a mixture layer containing the first pore-forming metal and the catalyst metal and
a second step in which at least one second pore-forming metal is sputtered or vapor-deposited on the mixture layer to form an interlayer containing the second pore-forming metal, the first step and the second step being alternately conducted repeatedly two or more times to thereby form a multilayer structure containing layers each of which is the mixture layer and layers each of which is the interlayer; and
a pore formation step in which after the layer superposition step, the first and second pore-forming metals in the multilayer structure are dissolved away to obtain a catalyst layer.

15. The catalyst-layer-supporting substrate of claim 1 that is made by a process comprising:
a layer superposition step comprising a first step in which at least one first pore-forming metal and at least one catalyst metal are sputtered or vapor-deposited on a substrate to form a mixture layer containing the first pore-forming metal and the catalyst metal and
a second step in which fibrous carbon is synthesized on the mixture layer to form an interlayer containing the fibrous carbon,
the first step and the second step being alternately conducted repeatedly two or more times to thereby form a multilayer structure containing layers each of which is the mixture layer and layers each of which is the interlayer; and
a pore formation step in which after the layer superposition step, the multilayer structure is subjected to a pore formation treatment to dissolve away the first pore-forming metal and thereby obtain a catalyst layer.

16. A membrane electrode assembly, comprising:
an anode-catalyst-layer-supporting substrate comprising a first substrate and an anode catalyst layer formed on the first substrate, the anode catalyst layer comprising two or more porous anode catalyst metal particle layers having a porosity ranging from 20% to 90% that are superposed alternately with two or more intersticed layers comprising (i) at least one element selected from the group consisting of Mn, Fe, Co, Ni, Zn, Sn, Al, and Cu or (ii) fibrous-carbon layers, wherein for (ii) the two or more porous catalyst metal particle layers having a porosity ranging from 20% to 90% are produced by removing a pore-forming metal from a mixture layer containing a pore-forming metal and the catalyst metal,
a cathode-catalyst-layer-supporting substrate comprising a second substrate and a cathode catalyst layer formed on the second substrate, the cathode catalyst layer comprising two or more porous cathode catalyst metal particle layers having a porosity ranging from 20% to 90% that are superposed alternately with two or more intersticed layers comprising (i) at least one element selected from the group consisting of Mn, Fe, Co, Ni, Zn, Sn, Al, and Cu or (ii) fibrous-carbon layers having interstices among the fibers of the fibrous carbon, wherein for (ii) the two or more porous catalyst metal particle layers having a porosity ranging from 20% to 90% are produced by removing a pore-forming metal from a mixture layer containing a pore-forming metal and the catalyst metal, and
a proton-conductive membrane sandwiched between the anode catalyst layer and the cathode catalyst layer.

17. The membrane electrode assembly according to claim 16, wherein the anode catalyst metal particle layers and the cathode catalyst metal particle layer comprises (ii) two or more fibrous carbon layers having interstices among fibers of the fibrous carbon containing carbon nanofibers, carbon nanotubes, and/or carbon black.

18. The membrane electrode assembly according to claim 16, wherein the anode catalyst metal particle layers and the cathode catalyst metal particle aggregate layers have a thickness of from 10 nm to 500 nm per layer and the intersticed layers of the anode catalyst layer and cathode catalyst layer have a thickness of from 10 nm to 500 nm per layer.

19. The membrane electrode assembly according to claim 16, wherein the anode catalyst metal particle layers and the cathode catalyst metal particle aggregate layers have a thickness of from 10 nm to 500 nm per layer and the fibrous-carbon layers of the anode catalyst layer and cathode catalyst layer have a thickness of from 500 nm to 5,000 nm per layer.

20. A fuel cell comprising the membrane electrode assembly according to claim 16.

21. The membrane electrode assembly according to claim 16, wherein the anode catalyst metal particle layers and the cathode catalyst metal particle layer comprises (i) at least one element selected from the group consisting of Mn, Fe, Co, Ni, Zn, Sn, Al, and Cu.

* * * * *